(12) United States Patent
Ye et al.

(10) Patent No.: US 6,909,652 B2
(45) Date of Patent: Jun. 21, 2005

(54) SRAM BIT-LINE REDUCTION

(75) Inventors: Yibin Ye, Hillsboro, OR (US); Dinesh Somasekhar, Hillsboro, OR (US); Muhammad M. Khellah, Lake Oswego, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 10/305,753

(22) Filed: Nov. 26, 2002

(65) Prior Publication Data

US 2004/0100815 A1 May 27, 2004

(51) Int. Cl.[7] ............................................. G11C 7/00
(52) U.S. Cl. ...................... 365/203; 365/154; 365/156
(58) Field of Search ............................. 365/203, 154, 365/156

(56) References Cited

U.S. PATENT DOCUMENTS 6,608,786 B2 * 8/2003 Somasekhar et al. ....... 365/203
6,724,649 B1 * 4/2004 Ye et al. ..................... 365/154
2004/0076059 A1 * 4/2004 Khellah et al. ............. 365/203

OTHER PUBLICATIONS

Agawa, Ken'ichi et al., "A Bit–Line Leakage Compensation Scheme for Low–Voltage SRAM's," 2000 Symposium on VLSI Circuits Digest of Technical Papers, pp. 70–71, Jun. 2000.

* cited by examiner

Primary Examiner—Michael S. Lebentritt
Assistant Examiner—Toan Le
(74) Attorney, Agent, or Firm—Jeffrey B. Huter

(57) ABSTRACT

A SRAM with reduced subthreshold leakage current, the SRAM including a pMOSFET with its gate at $V_{SS}$ and its source at $V_{CC}$, and a diode-connected pMOSFET with its source at $V_{CC}$, where the drains of the pMOSFET and the diode-connected pMOSFET are connected together to provide a voltage $V_{CCL}$, where $V_{SS}<V_{CCL}<V_{CC}$. The beta of the diode-connected pMOSFET is substantially larger than the beta of the pMOSFET. The wordline associated with each memory cell is driven to a voltage $-V_{EE}$ during a read operation, where $-V_{EE}<V_{SS}$ and $V_{EE} \leq V_{CC}-V_{CCL}$. Each memory cell has cross-coupled inverters to store a data bit, where the cross-coupled inverters have pMOSFETs with their sources at $V_{CCL}$.

21 Claims, 4 Drawing Sheets

SRAM BIT-LINE REDUCTION

FIELD

The present invention relates to digital circuits, and more particularly, to SRAM (Static Random Access Memory).

BACKGROUND

SRAM is used to store instructions or data in computer systems. For example, consider a computer system, such as that illustrated in FIG. 1. In FIG. 1, microprocessor die 102 comprises many sub-blocks, such as register files 104 and on-chip cache 106. Microprocessor 102 may also communicate to other levels of cache, such as off-chip cache 108. Higher memory hierarchy levels, such as system memory 110, are accessed via host bus 112 and chipset 114. In addition, other off-chip functional units, such as graphics accelerator 116 and network interface controller (NIC) 118, to name just a few, may communicate with microprocessor 102 via appropriate busses or ports. SRAM is used in register files 104 and on-chip cache 106, as well as perhaps other functional units shown in FIG. 1.

As technology scales to smaller dimensions, bit-line leakage current in SRAM may be a problem if not properly addressed. Consider a prior art SRAM shown in FIG. 2, comprising N transistor cells, where for simplicity only three cells are shown explicitly. Each cell comprises 6 transistors, two for each of the two cross-coupled inverters and two access transistors with their gates connected to a wordline. During pre-charge, Prech-Eq line 202 is held LOW so that pre-charge pMOSFETs 204 and 205 are ON to charge complementary bitlines 208 and 210 HIGH, and pMOSFET 212 is ON to equalize the voltages on complementary bitlines 208 and 210. After pre-charge, when a cell is read, its corresponding wordline is held HIGH, and a sense amplifier (not shown) senses differential current developed on complementary bitlines 208 and 210 as a result of the read operation.

Suppose the data stored in the SRAM is such that node 214 in the top-most cell shown in FIG. 2 is LOW and nodes 216 in all the other cells are LOW. This presents a worse-case scenario regarding leakage current, as is now discussed. Consider a read operation performed on the top-most cell. With wordline 218 HIGH, access transistor 218 is ON to sink a current $I_{drive}$ from bitline 208. The other wordlines are LOW, but because of the non-zero drain-to-source voltages in access transistors 222, each access transistor 222 leaks some current $I_{leak}$ from bitline 210. As a result, the effective current for developing a differential signal senses by the sense amplifier is $I_{drive} - (N-1)I_{leak}$, and the effective current is thereby reduced when the leakage current increases. Consequently, as leakage current increases, there may be an increase in the likelihood of an incorrect read operation.

DESCRIPTION OF EMBODIMENTS

Figure 3:
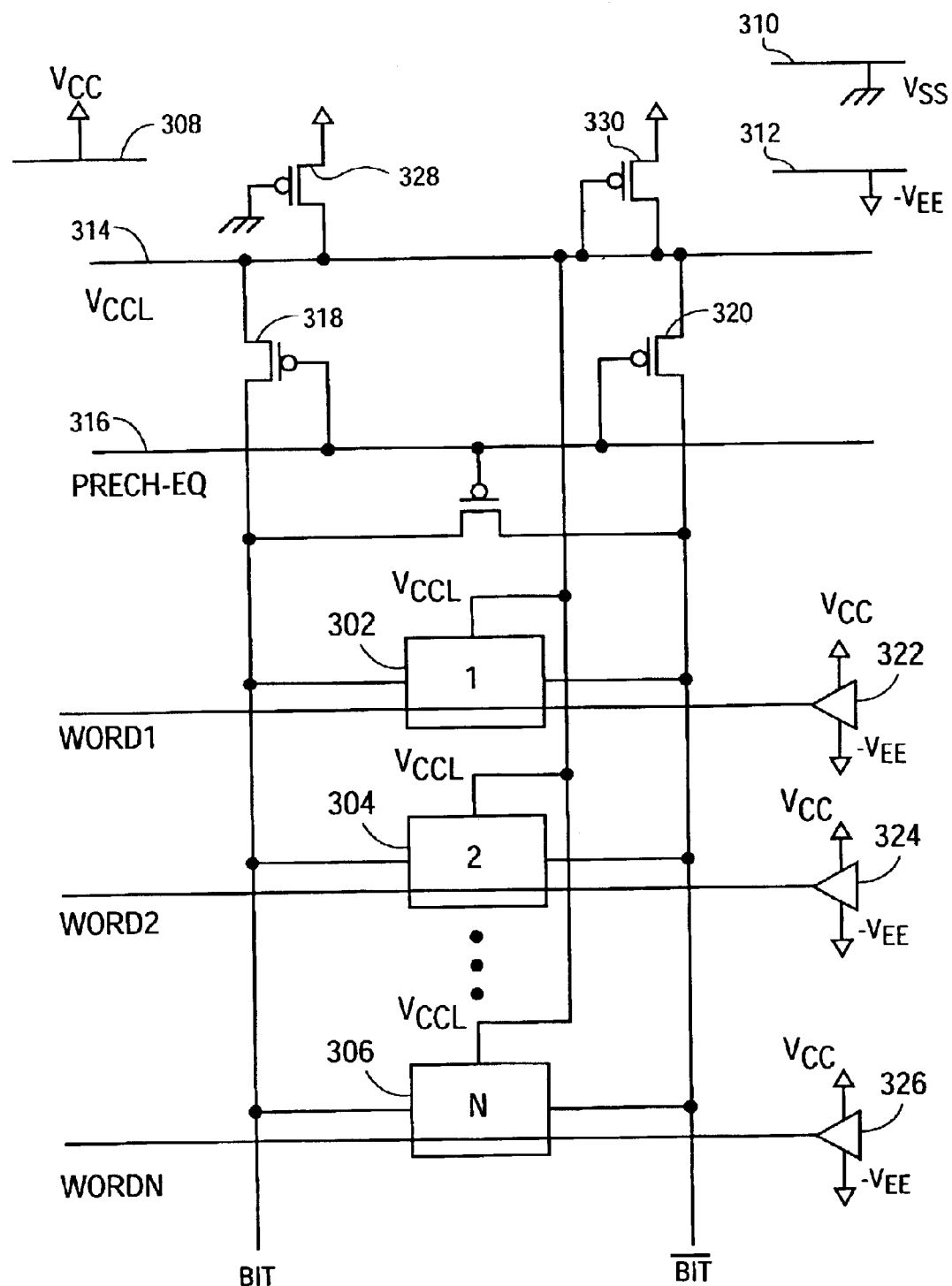
FIG. 3 is a SRAM according to an embodiment of the present invention.
Figure 4:
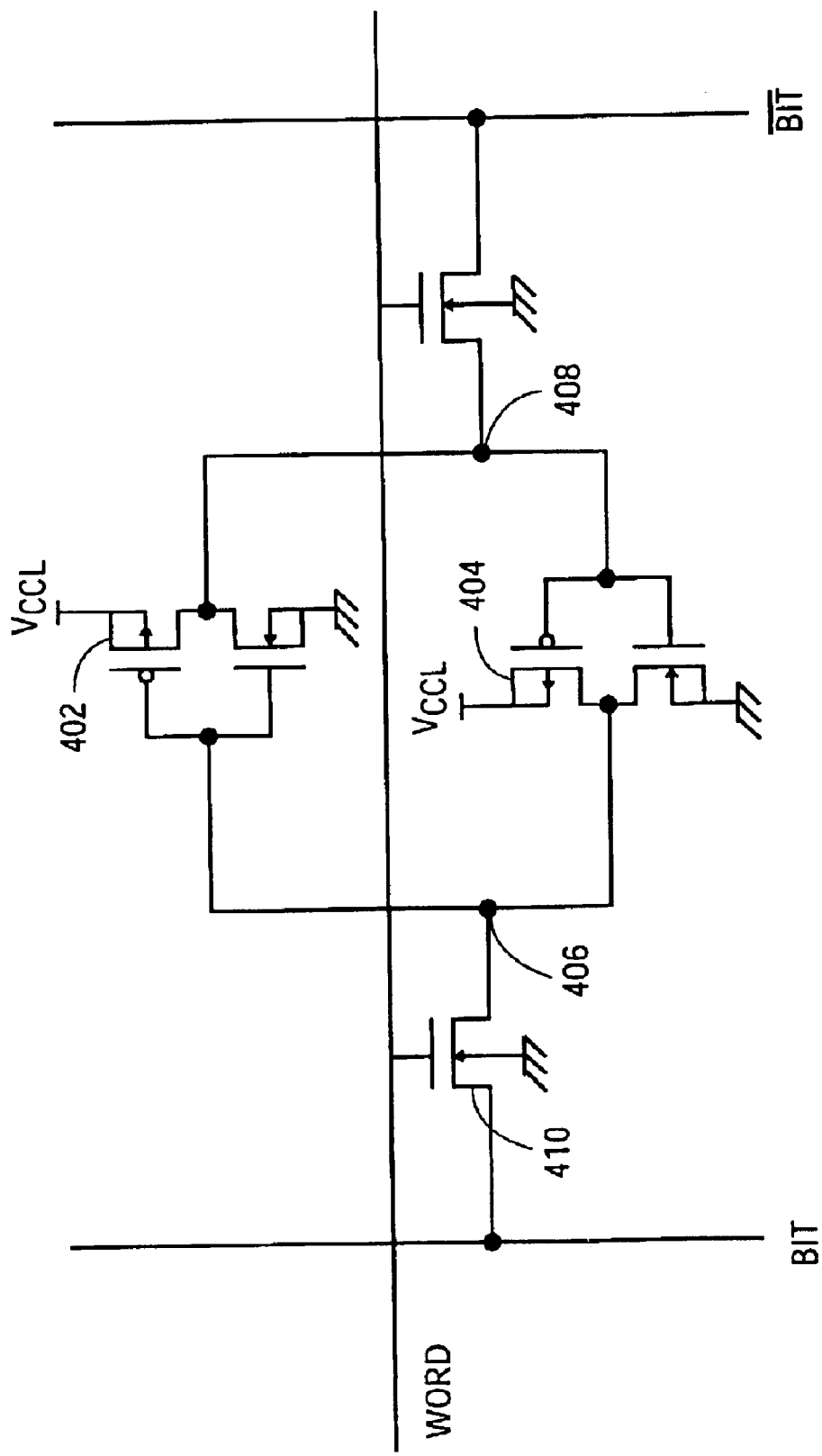
FIG. 4 is a memory cell in the SRAM of FIG. 3.

FIG. 3 shows a column of N memory cells in a SRAM for an embodiment of the present invention, where for simplicity only three memory cells 302, 304, and 306 of the N memory cells are explicitly shown. FIG. 4 shows the circuit for a memory cell in the embodiment of FIG. 3. Four voltages are indicated in FIG. 3. Supply rail 308 is at a supply voltage $V_{CC}$, supply rail 310 is at a voltage $V_{SS}$, supply rail 312 is at a voltage $-V_{EE}$, and supply rail 314 is at a voltage $V_{CCL}$, where $-V_{EE}<V_{SS}<V_{CCL}<V_{CC}$.

It is to be understood that the term "supply rail" as used in the above discussion is in general some kind of conductive material, such as a copper interconnect, power plane, doped polysilicon, or may be the integrated circuit substrate itself upon which the circuit of FIG. 3 is formed. The voltage $V_{SS}$ of supply rail 310 may not necessarily refer to the substrate voltage, and it may not necessarily be a ground voltage. However, because only voltage differences have physical significance, for ease of discussion it is convenient to take $V_{SS}=0$, in which case $-V_{EE}$ is a negative voltage. A typical range for $V_{EE}$ might be between 100 mV and 250 mV, for example.

During pre-charge, Prech-Eq line 316 is held at $V_{SS}$, and when no pre-charge is being performed, Prech-Eq line 316 is driven to $V_{CC}$. Pre-charge pMOSFETs 318 and 320 have their sources connected to rail 314, so that their sources are at $V_{CCL}$. Drivers 322, 324, and 326 indicate that during a read operation on a memory cell, its corresponding wordline is driven to the supply voltage $V_{CC}$, and when no read operation is performed, the wordline is driven to the negative voltage $-V_{EE}$. As seen in FIG. 3, the voltage $V_{CCL}$ is provided to each of the memory cells. Referring to the memory cell of FIG. 4, the sources of the pMOSFETs used in the cross-coupled inverters, pMOSFETs 402 and 404, are at the voltage $V_{CCL}$.

To maintain transistor reliability, the voltages should also satisfy the relationship: $V_{EE} \leq V_{CC} - V_{CCL}$, or equivalently, $V_{CCL} + V_{EE} \leq V_{CC}$. Because the magnitude of the largest voltage difference between the gate and source/drain of an access transistor is $V_{CCL} + V_{EE}$, this voltage relationship ensures that the magnitude of gate to source/drain voltage difference does not exceed $V_{CC}$.

Figure 1:
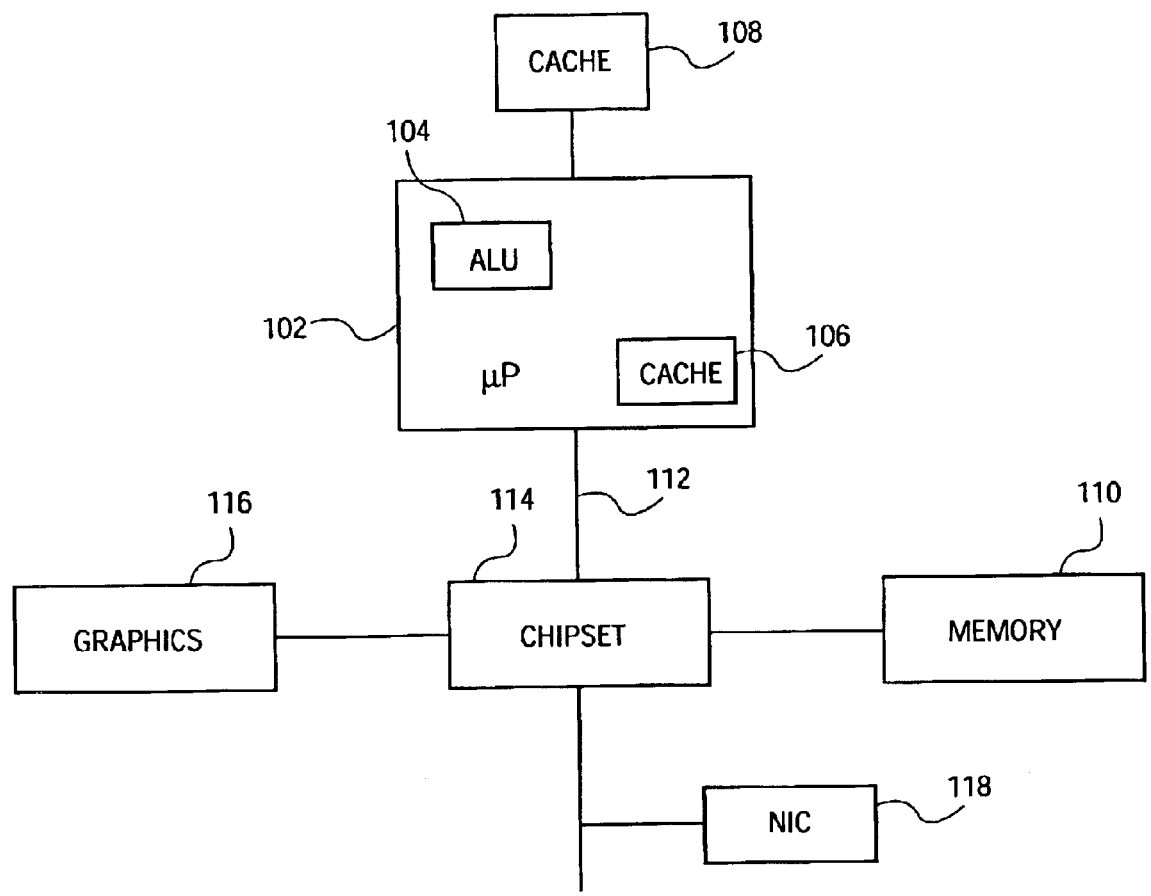
FIG. 1 is a high level abstraction of a computer system.
Figure 2:
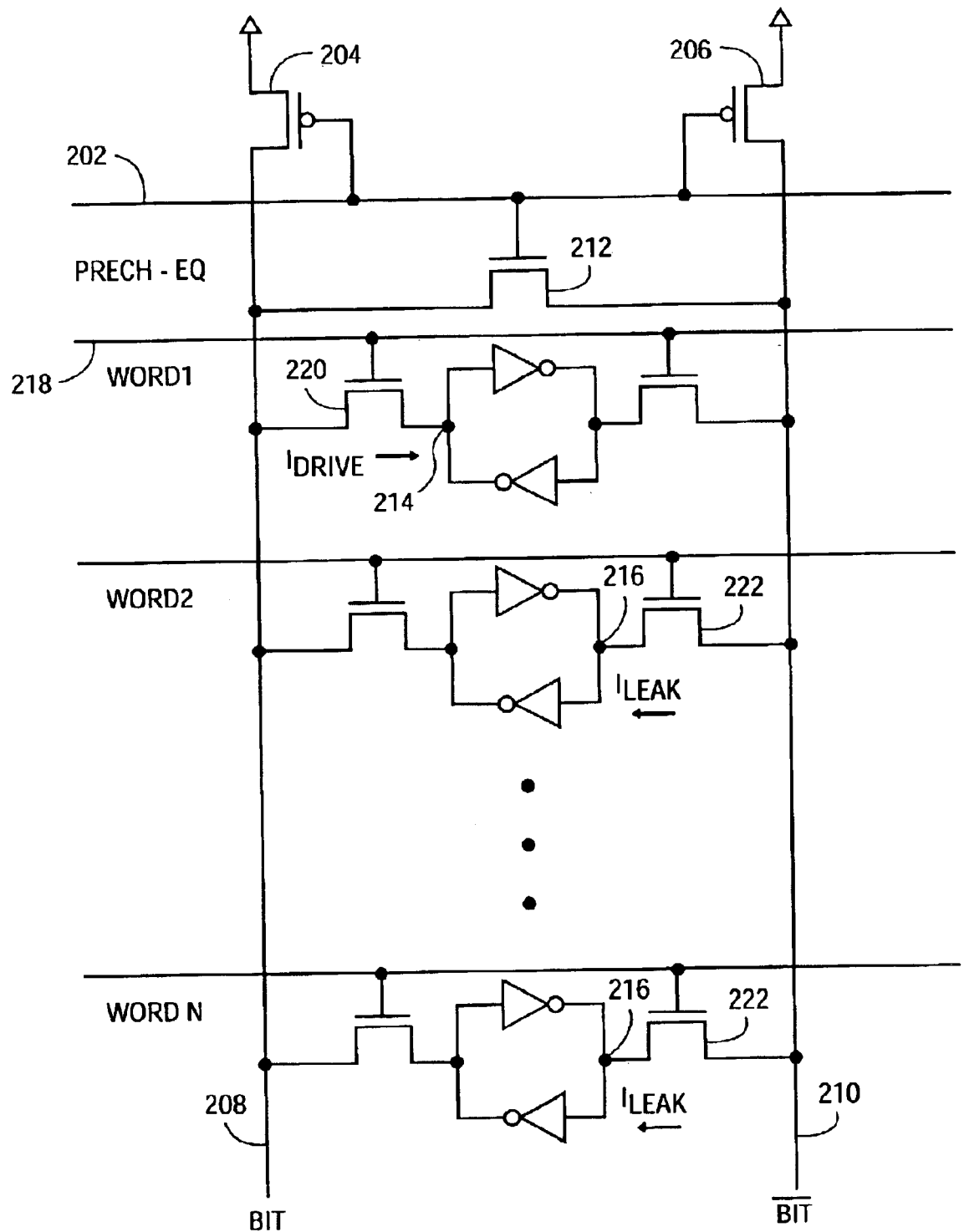
FIG. 2 is a prior art SRAM.

Before describing the roles of pMOSFETs 328 and 330, assume that rail 314 is maintained at the voltage $V_{CCL}$ that satisfies the earlier voltage relationship, $-V_{EE}<V_{SS}<V_{CCL}<V_{CC}$. During pre-charge, the bitlines are pre-charged to $V_{CCL}$. In an evaluation phase, the selected wordline is raised to $V_{CC}$ and the non-selected wordlines are driven to the negative voltage $-V_{EE}$. The leakage current through the access transistors in a non-selected cell is now greatly reduced because of the negative wordline voltage. For example, suppose that the data bit stored in the memory cell in FIG. 4 is such that node 406 is $V_{SS}$ and node 408 is $V_{CCL}$. The gate-to-source voltage of access transistor 410 is $-V_{EE}$, instead of zero for the prior art SRAM in FIG. 2, and consequently the subthreshold leakage current is significantly reduced.

The voltage $V_{CCL}$ is derived from $V_{CC}$ by pMOSFETs 328 and 330, with their drains connected to rail 314 and their sources connected to supply rail 308. The gate of pMOSFET 328 is connected to supply rail 310. pMOSFET 330 is diode-connected, with its gate connected to its drain. The beta of pMOSFET 330 is greater than the beta of pMOSFET 328. For example, the ratio of the beta of pMOSFET 330 to the beta of pMOSFET 328 may be at least 5, or for example, at least 10.

Suppose for the moment that pMOSFET 330 were not present, and $V_{CCL}$ was provided only by using pMOSFET 328. During pre-charge, the ON resistance of pMOSFET 328 provides a voltage drop due to the current demand of the pre-charge. This voltage drop determines $V_{CCL}$, and because the current demand for every pre-charge is approximately the same throughout the array structure of a SRAM, the size of pMOSFET 328 may be readily determined in the design stage to provide a desired voltage for $V_{CCL}$ during a pre-charge phase. However, current demand is not constant in time because of the large peak currents during an evaluation. If the beta of pMOSFET 328 is too large, these peak currents may cause too large of a voltage drop, resulting in a $V_{CCL}$ that is too low. When $V_{CCL}$ is too low, the performance of the sense amplifier connected to the bitlines may be adversely affected, and the memory cell stability decreases. On the other hand, if the beta of pMOSFET 328 is too small, the voltage drop may be too small, in which case the voltage relationship $V_{EE} \leq V_{CC} - V_{CCL}$ may not be satisfied to ensure transistor reliability.

It is expected that the combination of both pMOSFET 328 and pMOSFET 330 as shown in the embodiment of FIG. 3, where the beta of pMOSFET 330 is substantially larger than that of pMOSFET 328, may be designed so as to provide a proper $V_{CCL}$ for both a pre-charge and an evaluation. Diode-connected pMOSFET 330 runs ON when the voltage difference between $V_{CC}$ and $V_{CCL}$ is greater than its threshold voltage. During an evaluation phase when the current is large, pMOSFET 330 pulls $V_{CCL}$ slightly below $V_{CC} - V_T$, where $V_T$ is the threshold voltage of pMOSFET 330. pMOSFET 330 turns OFF when $V_{CCL}$ is pulled above $V_{CC} - V_T$. pMOSFET 328 is sized to supply non-peak current to the bitlines and memory cells, and maintains the desired voltage difference between $V_{CC}$ and $V_{CCL}$.

Various modifications may be made to the disclosed embodiments without departing from the scope of the invention as claimed below.

What is claimed is:

1. A memory comprising:
    a first supply rail;
    a second supply rail;
    a rail;
    a first pMOSFET comprising a source connected to the first supply rail, a gate connected to the second supply rail, and a drain connected to the rail; and having a first beta; and
    a second pMOSFET comprising a source connected to the first supply rail, a gate connected to the rail, and a drain connected to the rail; and having a second beta greater than the first beta.

2. The memory as set forth in claim 1, further comprising:
    a first bitline;
    a second bitline;
    a first pre-charge pMOSFET to provide a low impedance path between the first bitline and the rail if ON; and
    a second pre-charge pMOSFET to provide a low impedance path between the second bitline and the rail if ON.

3. The memory as set forth in claim 2, further comprising a memory cell, the memory cell comprising:
    a first inverter comprising a pMOSFET comprising a source connected to the rail; and
    a second inverter cross-coupled with the first inverter to store a data bit, the first inverter comprising a pMOSFET comprising a source connected to the rail.

4. The memory cell as set forth in claim 3, wherein the first supply rail is at a voltage $V_{CC}$, the second supply rail is at a voltage $V_{SS}$, and the rail is at a voltage $V_{CCL}$, where $V_{SS} < V_{CCL} < V_{CC}$.

5. The memory cell as set forth in claim 4, further comprising:
    a wordline connected to the memory cell; and
    a driver to drive the wordline to $-V_{EE}$ during a read operation on the memory cell, where $-V_{EE} < V_{SS}$.

6. The memory cell as set forth in claim 5, wherein $V_{EE} \leq V_{CC} - V_{CCL}$.

7. The memory cell as set forth in claim 6, wherein the second beta is at least five times greater than the first beta.

8. The memory cell as set forth in claim 1, wherein the second beta is at least five times greater than the first beta.

9. The memory as set forth in claim 8, further comprising:
    a first bitline;
    a second bitline;
    a first pre-charge pMOSFET to provide a low impedance path between the first bitline and the rail if ON; and
    a second pre-charge pMOSFET to provide a low impedance path between the second bitline and the rail if ON.

10. The memory as set forth in claim 9, further comprising a memory cell, the memory cell comprising:
    a first inverter comprising a pMOSFET comprising a source connected to the rail; and
    a second inverter cross-coupled with the first inverter to store a data bit, the first inverter comprising a pMOSFET comprising a source connected to the rail.

11. The memory cell as set forth in claim 10, wherein the first supply rail is at a voltage $V_{CC}$, the second supply rail is at a voltage $V_{SS}$, and the rail is at a voltage $V_{CCL}$, where $V_{SS} < V_{CCL} < V_{CC}$.

12. The memory cell as set forth in claim 11, further comprising:
    a wordline connected to the memory cell; and
    a driver to drive the wordline to $-V_{EE}$ during a read operation on the memory cell, where $-V_{EE} < V_{SS}$.

13. A SRAM comprising:
    a first supply rail;
    a rail;
    a first pMOSFET coupling the first supply rail to the rail, comprising a gate biased to a bias voltage, and having a first beta;
    a second pMOSFET, diode-connected, coupling the first supply rail to the rail, and having a second beta greater than the first beta;
    a first bitline coupled to the rail to be pre-charged during a pre-charge phase; and
    a second bitline coupled to the rail to be pre-charged during a pre-charge phase.

14. The SRAM as set forth in claim 13, the first supply rail having a voltage $V_{CC}$ and the rail having a voltage $V_{CCL}$ when in operation, where $V_{CCL} < V_{CC}$, the SRAM further comprising:
    a memory cell coupled to the first and second bitlines;
    a wordline connected to the memory cell; and
    a driver to drive the wordline to a voltage $-V_{EE}$ during a read operation on the memory cell, wherein $V_{EE} \leq V_{CC} - V_{CCL}$.

15. The SRAM as set forth in claim 14, the memory cell comprising cross-coupled first and second inverters to store a data bit, the first inverter comprising a pMOSFET comprising a source connected to the first supply rail and the second inverter comprising a pMOSFET comprising a source connected to the first supply rail.

16. The SRAM as set forth in claim 15, wherein the second beta is at least five times greater than the first beta.

17. The SRAM as set forth in claim 13, wherein the second beta is at least five times greater than the first beta.

18. The SRAM as set forth in claim 17, the first supply rail having a voltage $V_{CC}$ and the rail having a voltage $V_{CCL}$ when in operation, where $V_{CCL}<V_{CC}$, the SRAM further comprising:

a memory cell coupled to the first and second bitlines;

a wordline connected to the memory cell; and a driver to drive the wordline to a voltage $-V_{EE}$ during a read operation on the memory cell, wherein $V_{EE} \leq V_{CC}-V_{CCL}$.

19. A computer system comprising:

a system memory;

a microprocessor die comprising a cache, the cache comprising:

a first supply rail;

a rail;

a first pMOSFET coupling the first supply rail to the rail, comprising a gate biased to a bias voltage, and having a first beta;

a second pMOSFET, diode-connected, coupling the first supply rail to the rail, and having a second beta greater than the first beta;

a first bitline coupled to the rail to be pre-charged during a pre-charge phase; and a second bitline coupled to the rail to be pre-charged during a pre-charge phase.

20. The microprocessor die as set forth in claim 19, the first supply rail having a voltage $V_{CC}$ and the rail having a voltage $V_{CCL}$ when in operation, where $V_{CCL}<V_{CC}$, the cache further comprising:

a memory cell coupled to the first and second bitlines;

a wordline connected to the memory cell; and a driver to drive the wordline to a voltage $-V_{EE}$ during a read operation on the memory cell, wherein $V_{EE} \leq V_{CC}-V_{CCL}$.

21. The microprocessor die as set forth in claim 20, the memory cell comprising cross-coupled first and second inverters to store a data bit, the first inverter comprising a pMOSFET comprising a source connected to the first supply rail and the second inverter comprising a pMOSFET comprising a source connected to the first supply rail.

\* \* \* \* \*